United States Patent
Ogawa (10) Patent No.: US 6,191,987 B1
(45) Date of Patent: Feb. 20, 2001

(54) SEMICONDUCTOR MEMORY TEST CIRCUIT

(75) Inventor: Sumio Ogawa, Hiroshima (JP)

(73) Assignee: NEC Corporation, Tokyo (JP)

( * ) Notice: Under 35 U.S.C. 154(b), the term of this patent shall be extended for 0 days.

(21) Appl. No.: 09/490,249

(22) Filed: Jan. 24, 2000

(30) Foreign Application Priority Data

Jan. 26, 1999 (JP) .................................................. 11-016649

(51) Int. Cl.$^7$ ...................................................... G11C 7/00

(52) U.S. Cl. .................. 365/201; 365/185.2; 365/185.21

(58) Field of Search .............................. 365/201, 185.21, 365/185.2

(56) References Cited

U.S. PATENT DOCUMENTS 5,694,364 * 12/1997 Morishita et al. .................... 365/201
5,926,422 * 7/1999 Haukness .............................. 365/201

FOREIGN PATENT DOCUMENTS 4-146588  5/1992  (JP) .

* cited by examiner

Primary Examiner—Richard Elms
Assistant Examiner—Tuan T. Nguyen
(74) Attorney, Agent, or Firm—Hutchins, Wheeler & Dittmar (57) ABSTRACT

A semiconductor memory test circuit comprises a current mirror circuit including a reference side current path composed of a series connection of alternating p channel transistors and n channel transistors and an output side current path composed of a series connection of alternating p channel transistors and n channel transistors, an output signal for electrode of paired memory cells and a balance potential output signal for sense amplifier, required for a semiconductor memory test, being derived from the output side current path. The current mirror circuit includes a first output side current path and a second output side current path, the balance output for sense amplifier is derived from an output of the first output side current path and the output signal for electrode of paired memory cells is derived from an output of the second output side current path.

9 Claims, 12 Drawing Sheets

SEMICONDUCTOR MEMORY TEST CIRCUIT

BACKGROUND OF THE INVENTION

1. Field of the Invention

The present invention relates to a test circuit of a semiconductor memory and, particularly, to a semiconductor memory test circuit for aging memory cells of a dynamic RAM (DRAM).

2. Description of the Prior Art

In order to increase the integration density of semiconductor integrated circuit, the miniaturization of semiconductor integrated circuit has been enhanced year by year and this tendency is remarkable in semiconductor memories. Since, when the miniaturization of semiconductor memory is enhanced, the sizes of gates and contacts of transistors thereof are reduced and mutual distance between transistors is also reduced, the breakdown of insulating film due to voltage stress becomes a problem. In order to prevent such problem from occurring on a user side, the aging for preliminarily actualizing potential defects has been performed on a manufacturer side.

In the aging of semiconductor memory, BT (Bias•Temperature) test is usually used to effectively age a capacitive oxide film and an insulating film under high voltage and high temperature condition.

Figure 11:
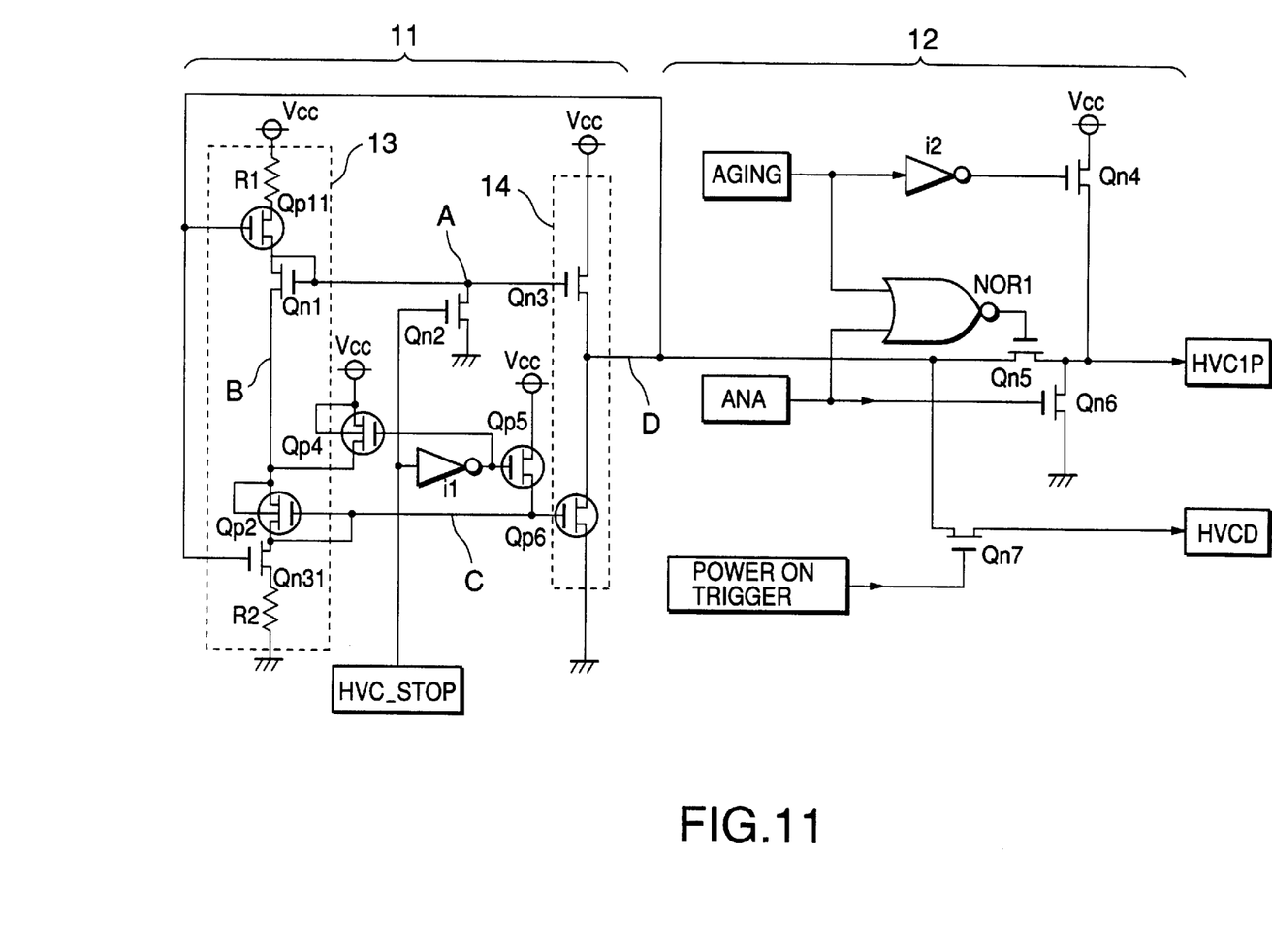
FIG. 11 is a circuit diagram of a conventional semiconductor memory test circuit.

FIG. 11 is a circuit diagram of a conventional semiconductor memory test circuit, in which a voltage application to memory cells is improved. The semiconductor memory test circuit is constructed with a HVC (Half-Vcc) circuit 11 for applying a voltage, which is a half of a power source voltage Vcc, to electrodes of paired memory cells and a control circuit 12 for controlling an output signal First Polysilicon at Half-Vcc (HVC1P) of the HVC circuit 11 to the electrodes of the paired memory cells and an output signal Digital Balance Potential at Half-Vcc (HVCD) thereof to a sense amplifier.

The semiconductor memory test circuit receives control signals including an input signal HVC-Stop for stopping the operation of the HVC circuit, an aging input signal AGING for performing an aging operation, an analysis input signal ANA for analyzing operation and a power source input signal Power-on-Trigger for switching the power source.

Figure 12:
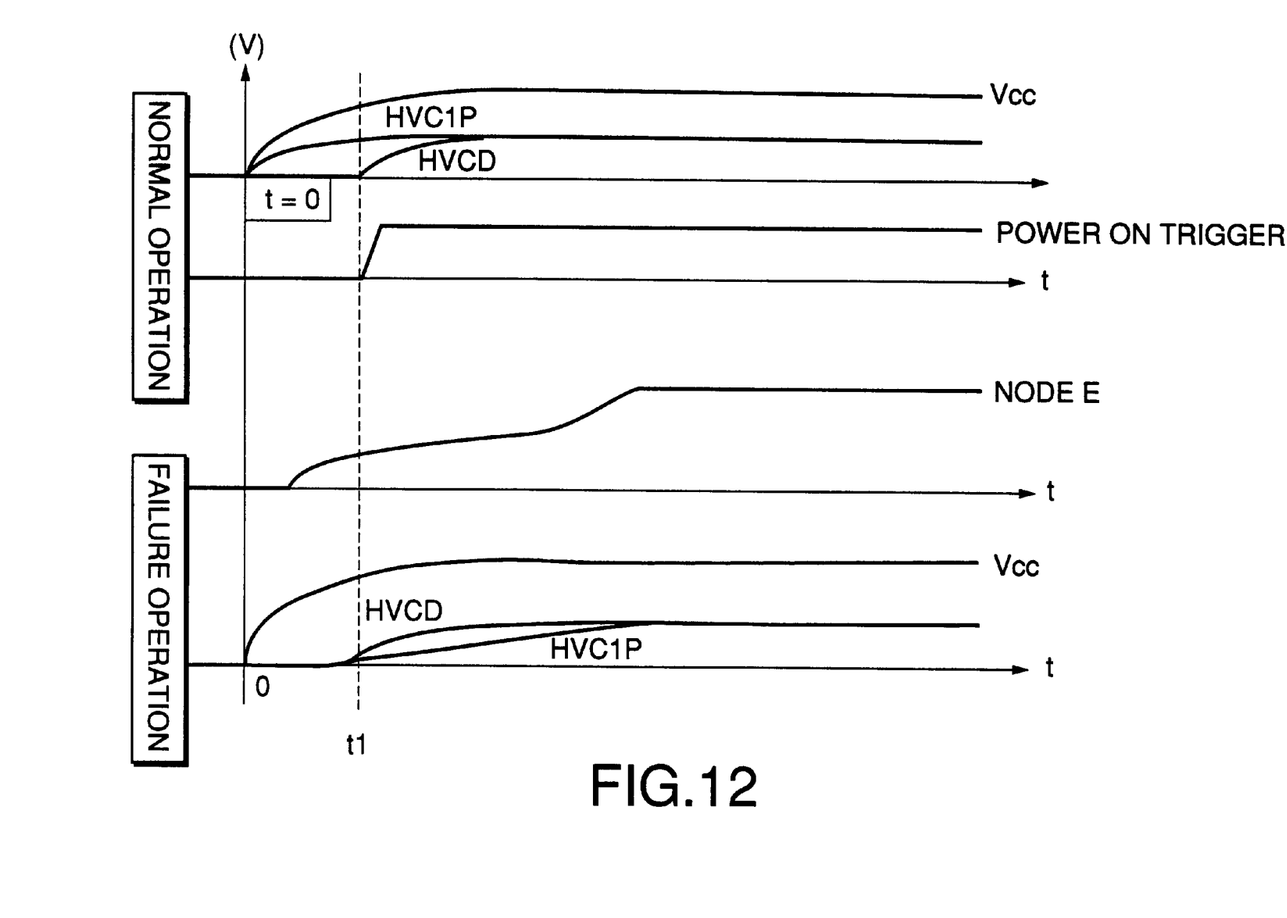
FIG. 12 shows signal waveforms in the semiconductor memory test circuit shown in FIG. 11.

The output signal HVC1P is supplied to the electrodes of paired memory cells of the DRAM memory. The potential of the output signal HVC1P is kept at Vcc/2 in a usual operation, Vcc in the aging operation and ground level (GND) during a failure analysis operation. FIG. 12 is a timing chart showing the potential levels of the output signals HVC1P and HVCD of the semiconductor memory test circuit shown in FIG. 11 at a time when the power source is turned ON. An upper portion of FIG. 12 shows these output signals when the result of test is normal and a lower portion thereof shows the output signals when the result of test is failure. In FIG. 12, when the power source is turned on at a time instance t=0, the potential of the output signal HVC1P is changed from the ground level to Vcc/2 during a period as short as several milliseconds. This potential must be higher than the potential of the output signal HVCD. In the normal operation, the potential of the output signal HVC1P is always kept at higher than that of the output signal HVCD and, in the failure operation, the potential of the output signal HVCD becomes higher than that of the output signal HVC1P.

The output signal HVCD is supplied to a balance potential input of the sense amplifier. The potential of the output signal HVCD is in Vcc/2 level during the normal operation, the aging operation and the failure analysis operation. At a time when the power source is turned on, the potential of the output signal HVCD starts to rise from the ground level at a time instance delayed from the turning on of the power source to Vcc/2 level within a time period of several milliseconds. Practically, some offset (several mV) may be added to the output signal HVC1P and/or the output signal HVCD. In this description, however, it is assumed that there is no such offset added.

In order to control the power supply to the HVC circuit, the input signal HVC-Stop controls the state of the node D whether the potential of the latter is made in Vcc/2 level or an impedance thereof is made high.

When the aging operation input or the analysis operation input to be described is made H level, the input signal HVC-Stop is made H level to perform the aging operation or the failure analysis operation. Although it is possible to measure small leak currents of the HVC1P output and the HVCD output by making the input signal AGING or the input signal ANA in H level, it is impossible to make both the input signal AGING and ANA in H level simultaneously.

The input signal AGING switches the output signal HVC1P between Vcc and Vcc/2. In the aging operation, the output signal HVC1P becomes Vcc level by making the input signal AGING in H level. In the normal operation, the output signal HVClP becomes Vcc/2 by making the input signal AGING in L level. The voltage stress of the capacitor becomes effective by this aging operation.

The input signal ANA switches the level of the output signal HVClP between the ground level and Vcc/2 level. In the failure analysis, the output signal HVClP becomes ground level bymaking the input signal ANA in H level and, in the normal operation, the output signal HVC1P becomes Vcc/2 by making the input signal ANA in L level. By this failure analysis, the insulation breakdown of the capacitor can be detected.

Figure 13:
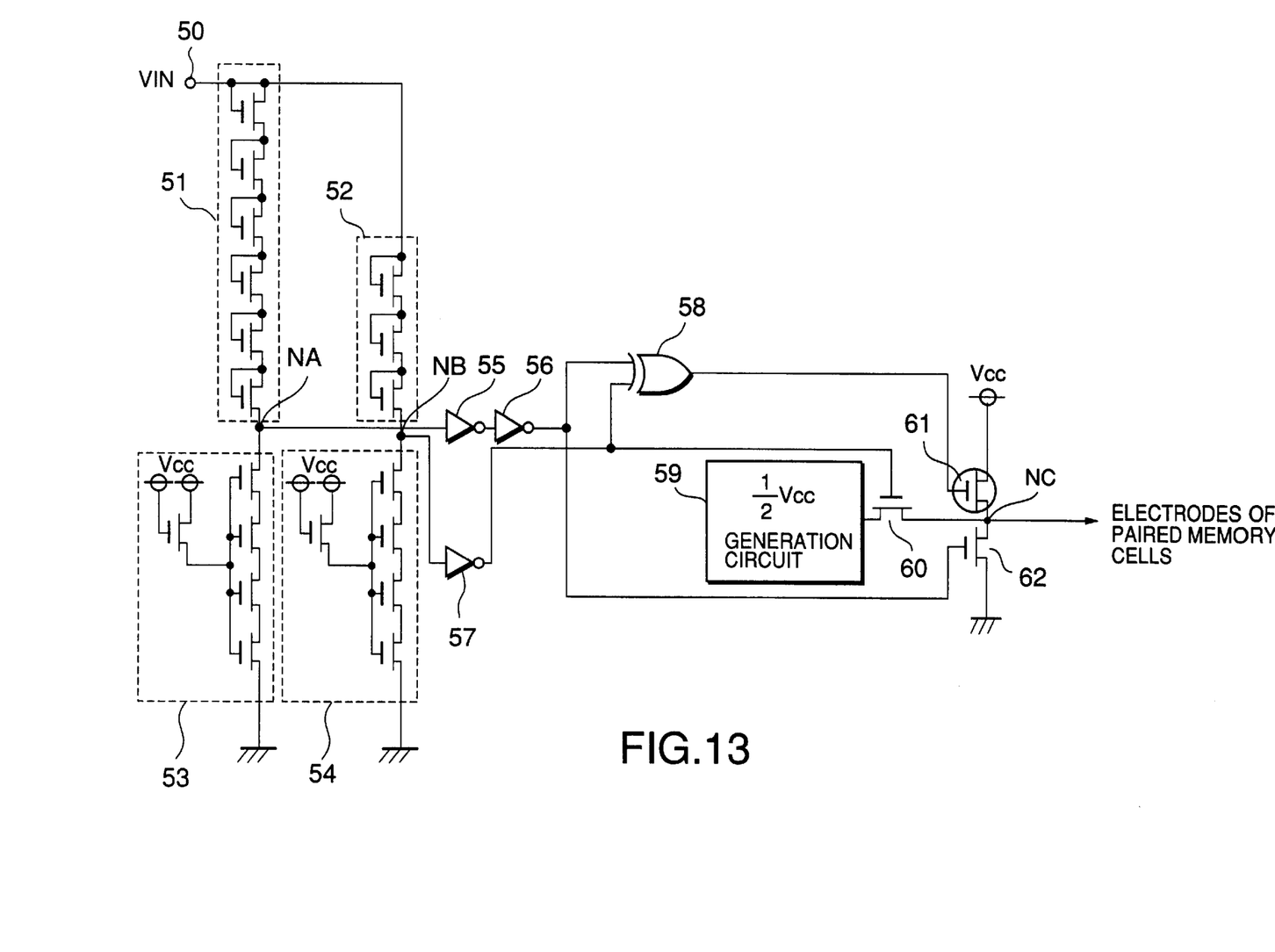
FIG. 13 is a circuit diagram of a semiconductor memory test circuit disclosed in Japanese Patent Application Laid-open No. H4-146588.

The input signal Power-on-Trigger switches the output signal HVCD between the same level as that of the output signal HVC1P and high impedance. When the input signal Power-on-Trigger is made in H level, the transistor Qn7 is turned ON, so that the output signal HVCD becomes in the same level as that of the output signal HVC1P. When the input signal Power-on-Trigger is made in L level, the transistor Qn7 is turned OFF, so that the output signal HVCD becomes high impedance. The output signal HVC1P must rise at higher rate than that of the output signal HVCD reliably at the time tO at which the power source is turned ON. Since signals, which rise from L level to H level in the time period of several milliseconds from t0 to t1, are supplied from other circuits, the input signal Power-on-Trigger is provided (FIG. 12) Japanese Patent Application Laid-open No. H4-146588 discloses a technique for switching a voltage level of the output signal HVC1P between the normal operation and the aging operation. FIG. 13 is a circuit diagram of a semiconductor memory test circuit disclosed in the above Japanese Patent Application Laid-open No. H4-146588. The disclosed semiconductor memory test circuit includes an input terminal 50 for applying a control voltage when a test is performed and an output terminal connected to electrodes of paired memory cells. The input terminal 50 is connected to a node NA through a 6-stage diode circuit 51 for detecting an applied potential and to a node NB through a 3-stage diode circuit 52 for detecting an applied potential. The node NA is connected to a ground through a 4-stage node pull-down transistor circuit 53 and to an input of an inverter 55. The node NB is connected to the ground through a 4-stage node pull-down transistor circuit 54 and to an input of an inverter 57. An output of the inverter 55 is connected through an inverter 56 to a first input of a 2-input EXOR gate 58 and a gate of an N channel type MOS transistor 62 connected between a node NC connected to the electrodes of the paired memory cells and the ground. An output of the inverter 57 is connected to a second input of the 2-input EXOR gate 58 and a gate of an N channel MOS transistor 60 connected between the node NC and a ½ Vcc generator circuit 59. An output of the 2-input EXOR gate 58 is connected to a gate of a P channel MOS transistor 61 connected between the node NC and the power source Vcc.

Upon a voltage VIN applied to the input terminal 50, the diode circuits 51 and 52 become conductive with voltages proportional to the numbers of the N channel MOS transistors constituting the diode circuits, respectively. In this case, the value of the input voltage VIN, with which the diode circuits 51 and 52 are turned ON, are VA and VB (VA>VB). Since the N channel MOS transistors constituting the node pull-down stages 53 and 54 are in ON state, the nodes NA and NB are kept in L level.

In a case where VB>VIN, the MOS transistors 61 and 62 are turned OFF and the MOS transistor 60 is turned ON. Therefore, the output to the electrode of the paired memory cells becomes Vcc/2 level.

In a case where VA>VIN>VB, the MOS transistors 60 and 62 are turned OFF and the MOS transistor 61 is turned ON. Therefore, the output to the electrode of the paired memory cells becomes Vcc level.

In a case where VIN>VA, the MOS transistors 60 and 61 are turned OFF and the MOS transistor 62 is turned ON. Therefore, the output to the electrode of the paired memory cells becomes ground level.

As above mentioned, it is possible to switch the output signal level between Vcc/2, Vcc and ground level by the value of the input voltage VIN applied to the input terminal 50.

In the Japanese Patent Application Laid-open No. H4-146588, the voltage level Vcc/2 is produced by the control transistor 60 connected between the node NC and the ½ Vcc generator circuit 59. Therefore, the boot phenomenon to be described later may occur. Further, since the transistors 61 and 62 connected between the power source Vcc and the ground are controlled through a logic circuit, there may be a case where both the transistors 61 and 62 are turned ON in an unstable state when the power source is turned ON causing a through-current to flow. Incidentally, there is no description in the Japanese Patent Application Laid-open No. H4-146588 of a control of an output to a sense amplifier for providing an effective voltage stress between a first contact and a gate.

The reason for that the control transistor connected between the circuit for supplying the voltage in ½ Vcc level causes the boot phenomenon to occur will be described with reference to FIG. 11. The operation speed of the transistor Qn5 for controlling the output signal to the electrode of paired memory cells is delayed when the power source is turned ON, for two reasons. One of the reasons is an increase of the threshold voltage. That is, the voltage between a source and drain of the transistor Qn5 is in Vcc/2 level and a potential difference between the source and a substrate thereof is large compared with that of a transistor having a source at ground potential. With such large potential difference between the source and the substrate, the threshold voltage of the transistor becomes high. The other reason is a delay in operation of the NOR1 gate which drives the gate of the transistor Qn5. That is, the NOR circuit performs the power supply and signal transmission through a wiring having arbitrary length. Therefore, if the length of the wiring is large, the drive of the transistor Qn5 is delayed. In such case, there is a possibility that the rising rates of the output voltage to of the electrodes of paired memory cells and the output voltage to the sense amplifier become close.

BRIEF SUMMARY OF THE INVENTION

OBJECTS OF THE INVENTION

An object of the present invention is to provide a semiconductor memory test circuit capable of improving a working efficiency of the aging and the failure analysis without boost phenomenon, by switching the voltage level of the output signal to electrodes of paired memory cells of a DRAM memory as well as the voltage level of the output signal to a sense amplifier.

SUMMARY OF THE INVENTION

A semiconductor memory test circuit according to the present invention comprises a current mirror circuit having a reference side current path composed of a series connection of alternating p channel transistors and n channel transistors and an output side current path composed of a series connection of alternating p channel transistors and n channel transistors, an output signal for an electrode of paired memory cells and a balance potential output signal for a sense amplifier, required for a semiconductor memory test, being derived from the output side current path, wherein the current mirror circuit includes a first output side current path and a second output side current path, the balance output for the sense amplifier is derived from an output of said first output side current path and the output signal for the electrode of paired memory cells is derived from an output of the second output side current path.

BRIEF DESCRIPTION OF THE DRAWINGS

The above-mentioned and other objects, features and advantages of this invention will become more apparent by reference to the following detailed description of the invention taken in conjunction with the accompanying drawings, in which.

DETAILED DESCRIPTION OF THE INVENTION

Prior to the description of the present invention, the causes of failure occurrence in a semiconductor memory to be tested will be described with reference to FIGS. 4 and 5.

Figure 4:
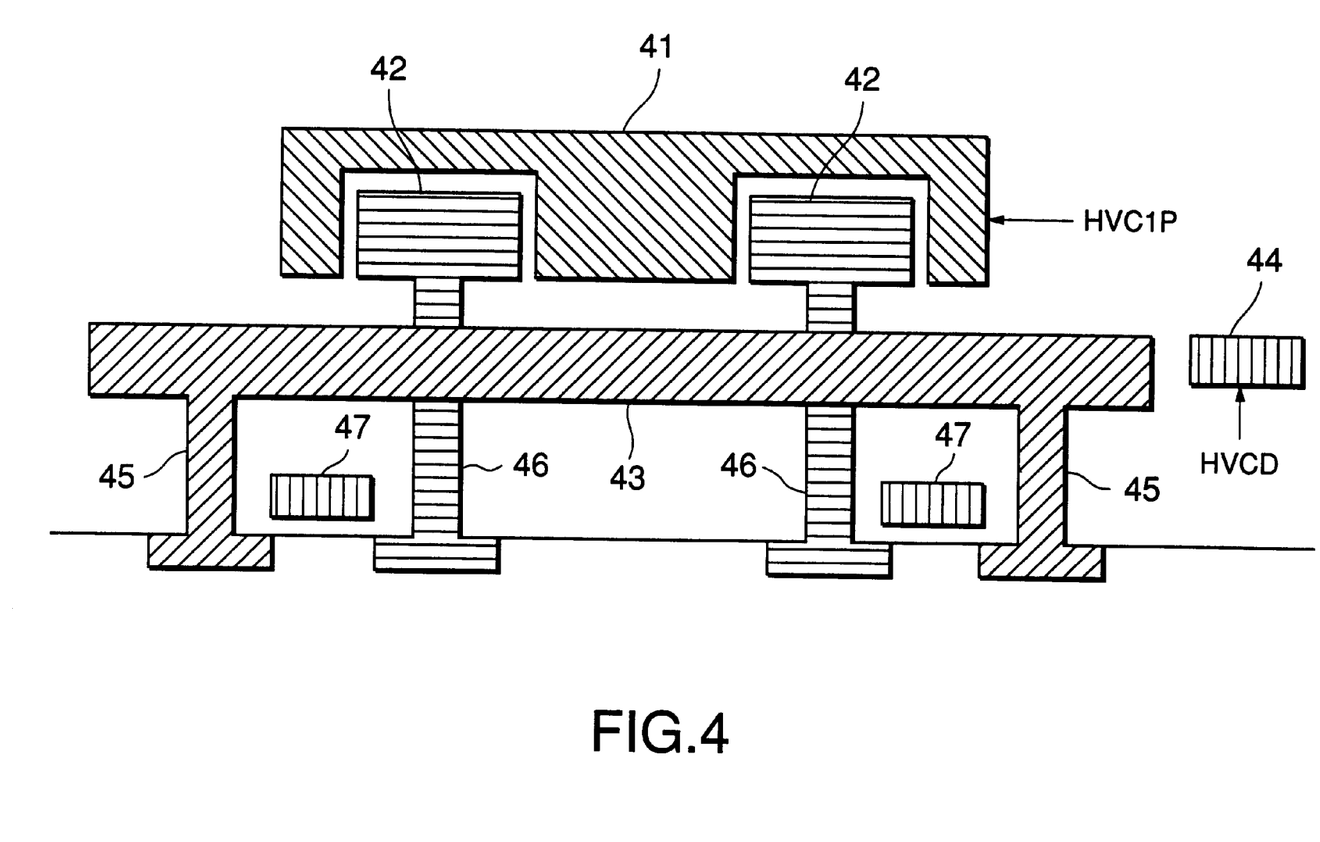
FIG. 4 is a cross section of a normal DRAM memory cell.

In FIG. 4 which shows a cross section of a normal DRAM memory cell, is constructed with capacitors 42, a paired memory cell electrode 41, a digit line 43, first contacts 45, capacitive contacts 46 and gates 47. The capacitors 42, which may be of stack type, planar type, trench type or stack trench type, are formed above and connected electrically to the digit line 43. The paired memory cell electrode 41 is formed on the capacitors 42 through an insulating film. The first contacts 45 and the capacitive contacts 46 are formed below and electrically connected to the digit line 43. The gates 47 are formed below the digit line 43 through an insulating film. The digit line 43 is connected to an input of a sense amplifier 44 and the paired memory cell electrode 41 is electrically connected to a paired memory cell electrode output HVC1P of a semiconductor memory test circuit during BT test period. Each select transistor of the DRAM memory cell is constructed with the gate 47, the first contact 45 and the capacitive contact 46 so that an information of 2 bits can be stored in the memory cell. A word line, which is not shown, is electrically connected to the gates 47.

Figure 5:
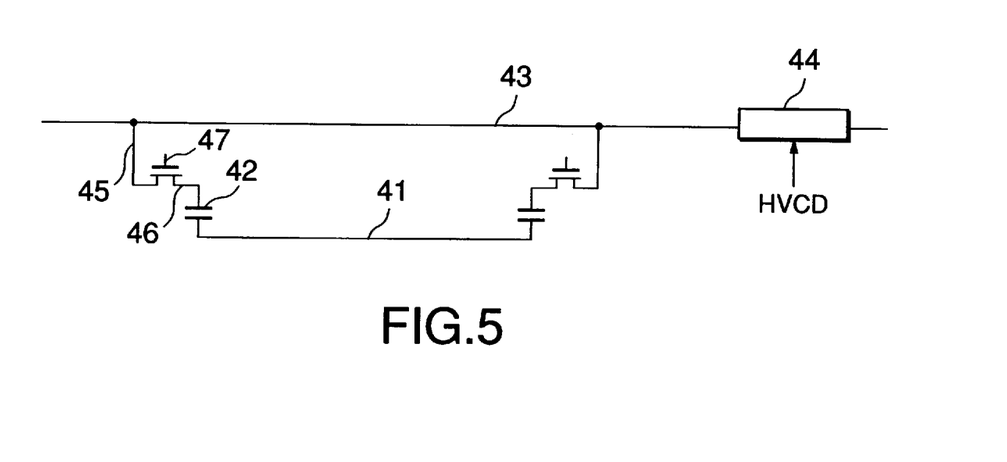
FIG. 5 is an equivalent circuit of the DRAM memory cell shown in FIG. 4.
Figure 6:
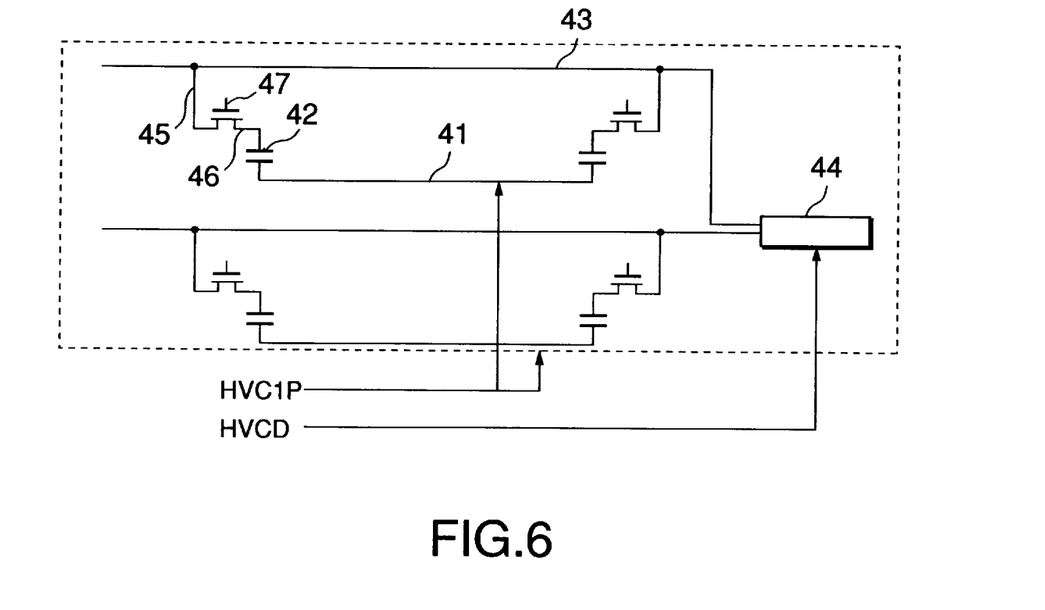
FIG. 6 is a circuit diagram showing a connection between a sense amplifier and respective DRAM memory cells.
Figure 7:
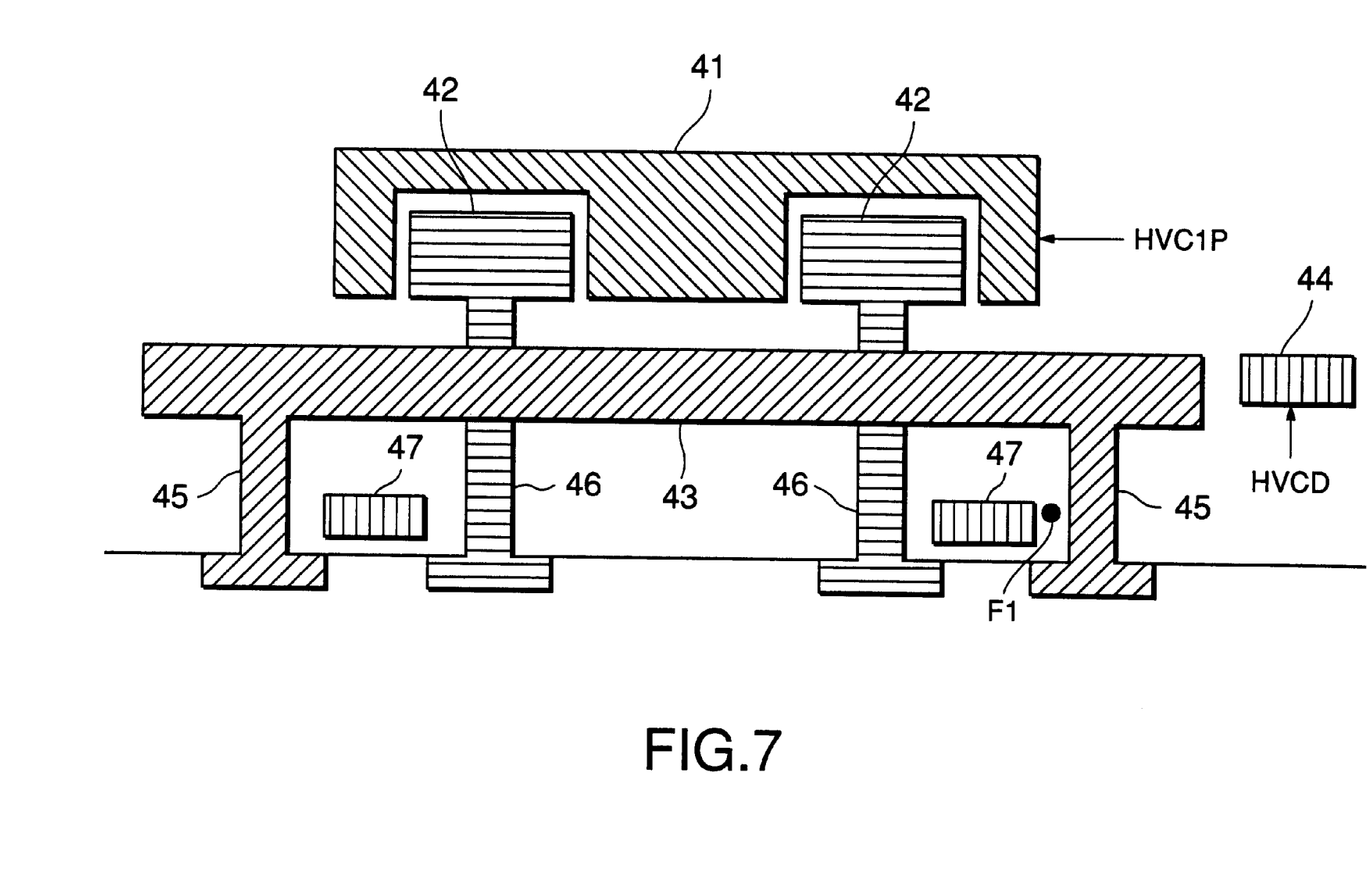
FIG. 7 is a cross section of a DRAM memory cell, which has an insulation breakdown between a first contact and a gate thereof.
Figure 8:
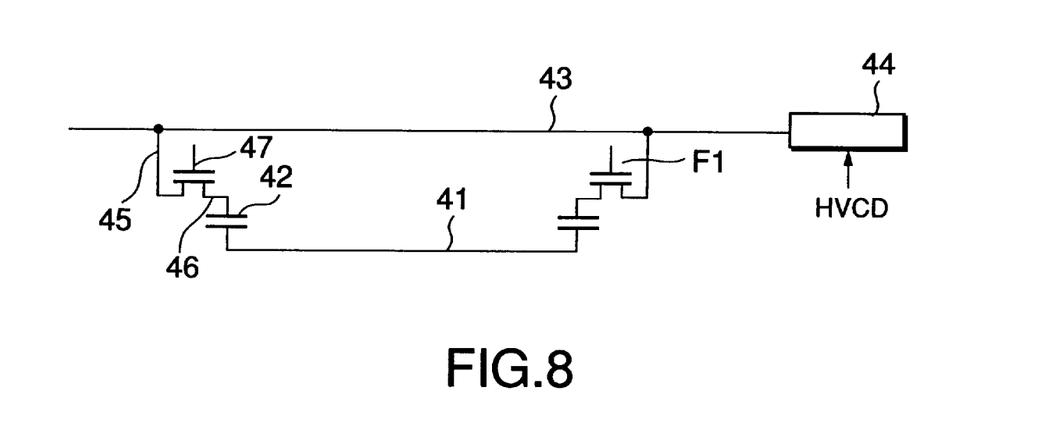
FIG. 8 is an equivalent circuit of the DRAM memory cell shown in FIG. 7.

FIG. 5 shows an equivalent circuit of the DRAM memory cell shown in FIG. 4 and FIG. 6 is a circuit diagram of a DRAM memory cell array including a plurality of DRAM memory cells each shown in FIG. 5. In FIG. 6, the digit lines 43 of the respective DRAM memory cells are connected to inputs of the corresponding sense amplifier 44 and the gates of the respective select transistors are connected to the word lines, which are not shown. The output HVC1P of the semiconductor memory test circuit is supplied to the electrode 41 of the paired memory cells and an output HVCD of the semiconductor memory test circuit is supplied to a reference voltage input terminal of the sense amplifier 44. In the usual operation such as write or read, etc., the electrode 41 of the paired memory cells is kept at a potential equal to a half of power source voltage Vcc. The purpose of use of this potential, that is, Vcc/2, of the DRAM is to make stress related to the breakdown of insulating film of the memory cell a half, to increase noise tolerance of the sense amplifier and to reduce power consumption. The capacitor 42 is charged or discharged by a potential difference between the digit line 43 and the paired memory cell electrode 41 of the DRAM memory cell selected by the word line, to write an information of 1 or 0. Further, the sense amplifier 44 reads the information of 1 or 0 by a potential difference between the digit line 43 and the reference voltage input terminal.

When a rising rate of the output signal HVC1P of the semiconductor memory test circuit, which is supplied to the electrode 41 of the paired memory cells, is lower than that of the output signal HVCD of the semiconductor memory test circuit, which is supplied to the sense amplifier, the boot phenomenon occurs, so that the content of the memory cell is changed. That is, if the potential of the electrode 41 of the paired memory cells, which is lower than the potential of the digit line 43, is not increased to the high level till a time of a first write operation, the capacitor 42 is charged. In such case, if the information value stored in the DRAM memory cell is 0, it tends to be changed to 1. When the degree of boot phenomenon is not so severe, the unintended change of the stored information can be recovered by a subsequent refresh operation. However, the number of accesses required for the refresh operation is larger than the usual number of accesses defined in a specification. For example, in a case of a 1K refresh device, sequential 1024 accesses are required for the refresh operation. That is, the number of accesses is larger by 1016 than the 8 random accesses defined in the specification. Such large number of accesses degrades the aging efficiency and, in the worst case, the DRAM memory cell may be destroyed.

Figure 1:
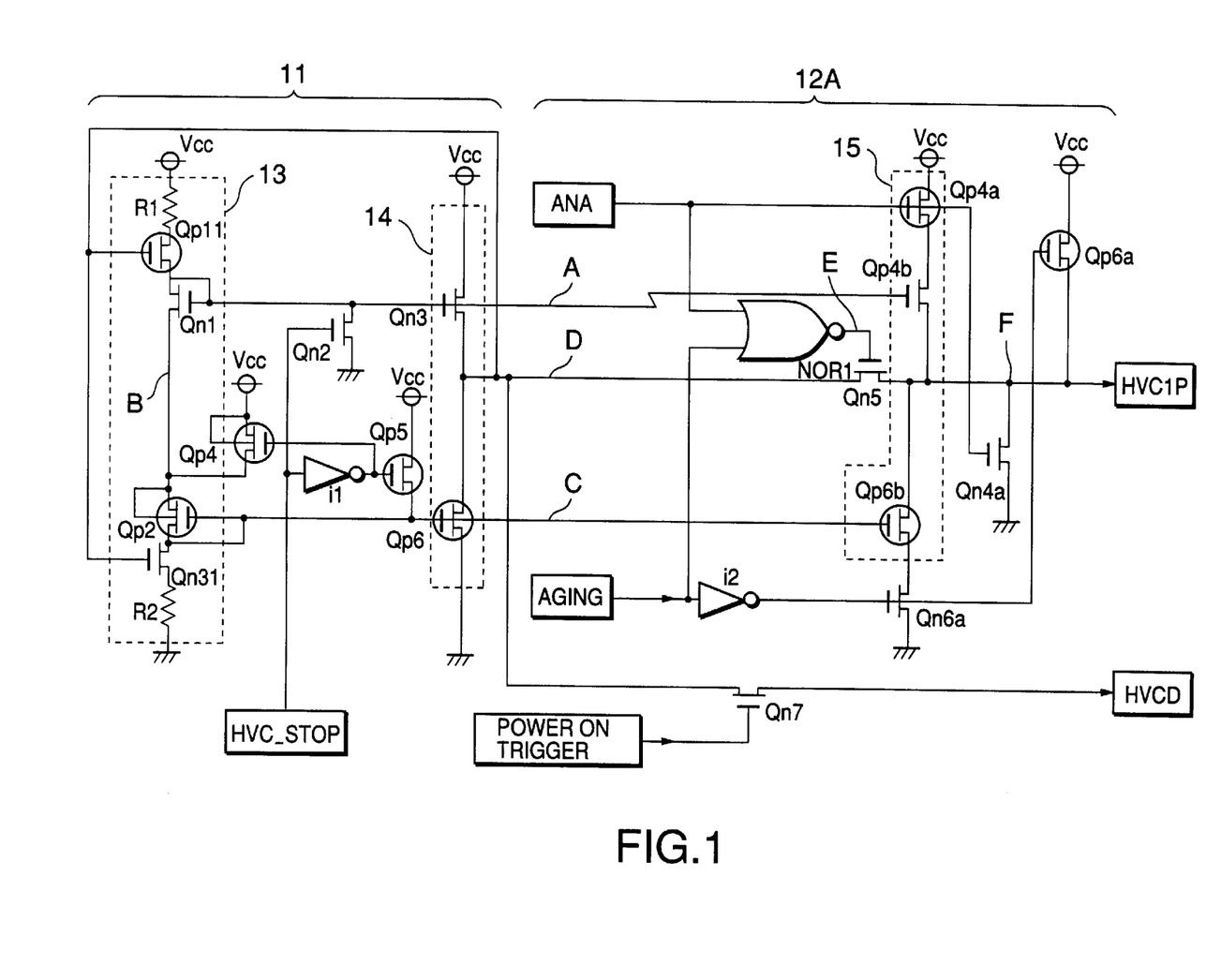
FIG. 1 is a circuit diagram of a semiconductor memory test circuit according to a first embodiment of the present invention.

Now, the semiconductor memory test circuit according to the present invention will be described with reference to the drawings. FIG. 1 is a circuit diagram of the semiconductor memory test circuit according to a first embodiment of the present invention. The semiconductor memory test circuit is constructed with a HVC circuit 11 for supplying a voltage of Vcc/2 and a control circuit 12A for controlling an output HVC1P of the HVC circuit 11, which is to be supplied to an electrode of paired memory cells, and an output HVCD of the HVC circuit 11, which is to be supplied to a sense amplifier. The semiconductor memory test circuit includes an input terminal for receiving a signal HVC-Stop for stopping an operation of the HVC circuit, an input terminal for receiving an input signal AGING for performing an aging operation, an input terminal for receiving an input signal ANA for performing an analysis operation and an input terminal for receiving an input signal Power-on-Trigger for turning a power source ON, in addition to the output terminal for supplying the output signal HVC1P and the output terminal for supplying the signal HVCD.

In the semiconductor memory test circuit of this embodiment, the voltage of Vcc/2 is supplied to the electrode 41 of the paired memory cells not through an N channel transistor Qn5 but through a second output side current path 15 of a current mirror circuit. In this description, the input signals, which are not specifically noted, are in L level at a time instance t1 after the power source is turned ON, although the level of the input signal Power-on-Trigger is changed from L level to H level.

The HVC circuit 11 takes in the form of a 2-stage current mirror circuit composed of N channel transistors and P channel transistors. A reference side current path of the current mirror circuit is composed of a resistor R1, a P channel transistor Qp11, an N channel transistor Qn1, a P channel transistor Qp2, an N channel transistor Qn 31 and a resistor R2, which are series-connected in the sequence between the power source Vcc and the ground GND. A first output side current path 14 of the current mirror circuit is composed of an N channel transistor Qn3 and a P channel transistor Qp6, which are series-connected between the power source Vcc and the ground. A node A connecting a gate of the N channel transistor Qn1 of the reference side current path 13 to a gate of the N channel transistor Qn3 of the first output side current path 14 is connected to a drain of the transistor Qn1 and to the ground through the N channel transistor Qn2.

Anode C connecting a gate of the P channel transistor Qp2 of the reference side current path 13 to a gate of the P channel transistor Qp6 of the first output side current path 14 is connected to a drain of the transistor Qp2 and to the power source Vcc through a P channel transistor Qp5. A node B connecting a source of the N channel transistor Qn1 of the reference side current path 13 to a source of the P channel transistor Qp2 is connected to the power source Vcc through a P channel transistor Qp4. The gates of the P channel transistor Qp11 and the N channel transistor Qn31 of the reference side current path 13 are connected to a node D which connects sources of the N channel transistor Qn3 and the P channel transistor Qp6 of the first output side current path 14 together.

The signal HVC-Stop is supplied to the gate of the n channel transistor Qn2 and an input of an inverter i1. An output of the inverter i1 is supplied to the gates of the P channel transistor Qp4 and the P channel transistor Qp5.

Currents flowing through the reference side current path 13 and the first output side current path 14 are constants, respectively. However, since the constant current flowing through the first output side current path 14 is larger than the constant current flowing through the reference side current path 13, the size of the respective transistors constituting the current mirror circuit is different. The reference side current path 13 of the current mirror circuit maintains the potential of the node D at Vcc/2 by changing voltages between the drains and sources of the transistors Qp11 and Qn31 of the reference side current path 13 of the current mirror circuit and supplies voltages to the nodes A and C to drive the transistors of the output side current path 14 thereof. The first output side current path 14 supplies a voltage in Vcc/2 level to the sense amplifier.

Since, in the reference side current path 13, the resistance values of the resistors R1 and R2 are larger than ON resistances of the transistors Qp11, Qn1, Qp2 and Qn31, the voltage level of the node D is determined by a ratio of the resistance value of the resistor R1 to that of the resistor R2. The resistance values of the resistors R1 and R2 are set such that they can correct a variation of electric characteristics of the respective transistors constituting the current mirror circuit and maintain the threshold voltages Vt between sources and drains thereof.

When the signal HVC-Stop is in L level, the transistors Qn2, Qp4 and Qp5 are turned OFF, so that the reference side current path 13 and the first output side current path 14 of the current mirror circuit operate.

When the signal HVC-Stop is in H level, the transistors Qn2, Qp4 and Qp5 are turned ON, so that the nodes A and C are fixed to the GND level and the Vcc level, respectively. Therefore, the reference side current path 13 and the first output side current path 14 of the current mirror circuit stop their functions, so that an impedance of the node D becomes high. The second output side current path 15 of the current mirror circuit, which is constructed by connecting the gates of the transistors to the nodes A and C, operates in relation to the reference side current path in the same way as that of the first output side current path 14.

The control circuit 12A is constituted with a switching circuit and the second output side current path 15 of the current mirror circuit. The second output side current path 15 is composed of a series-connection of a P channel transistor Qp4a, an N channel transistor Qn4b, a P channel transistor Qp6b and an N channel transistor Qn6a, the series connection being connected between the power source Vcc and the ground GND. A gate of the N channel transistor Qn4b of the second output side current path 15 is connected to the node A and a gate of the P channel transistor Qp6b is connected to the node C. A node F, to which sources of the transistors Qn4b and Qp6b are connected, is connected to the electrode of the paired memory cells, to the node D through the N channel transistor Qn5, to the power source Vcc through the P channel transistor Qp6a and to the ground GND through the N channel transistor Qn4a.

The analysis operation input signal ANA is supplied to a first input of a 2-input NOR gate NOR1 and an input of an inverter i2. An output of the inverter i2 is connected to the gate of the N channel transistor Qn5.

The input signal Power-on-Trigger is supplied to the gate of the N channel transistor Qn7 and the output signal HVCD is supplied to the node D through the N channel transistor Qn7.

When the input signal ANA and the input signal AGING are in L level, the transistors Qp4a, Qn6a and Qn5 are turned ON and the transistors Qp6a and Qp4a are turned OFF. Therefore, the second output side current path 15 operates, so that the output signal HVC1P becomes Vcc/2 level.

When the input signal ANA is in H level, the transistor Qp4a is turned ON and the transistors Qp4a and Qn5 are turned OFF. Therefore, the function of the second output side current path 15 is stopped and the output signal HVC1P becomes ground level.

When the input signal AGING is in H level, the transistor Qp6a is turned ON and the transistors Qn6a and Qn5 are turned OFF. Therefore, the function of the second output side current path 15 is stopped and the output signal HVC1P becomes Vcc level.

When the input signal Power-on-Trigger is in L level, the transistor Qn7 is turned OFF, so that the output signal HVCD becomes high impedance. When the input signal Power-on-Trigger is in H level, the transistor Qn7 is turned ON, so that the output signal HVCD becomes Vcc/2 level which is the potential of the node D.

Figure 9:
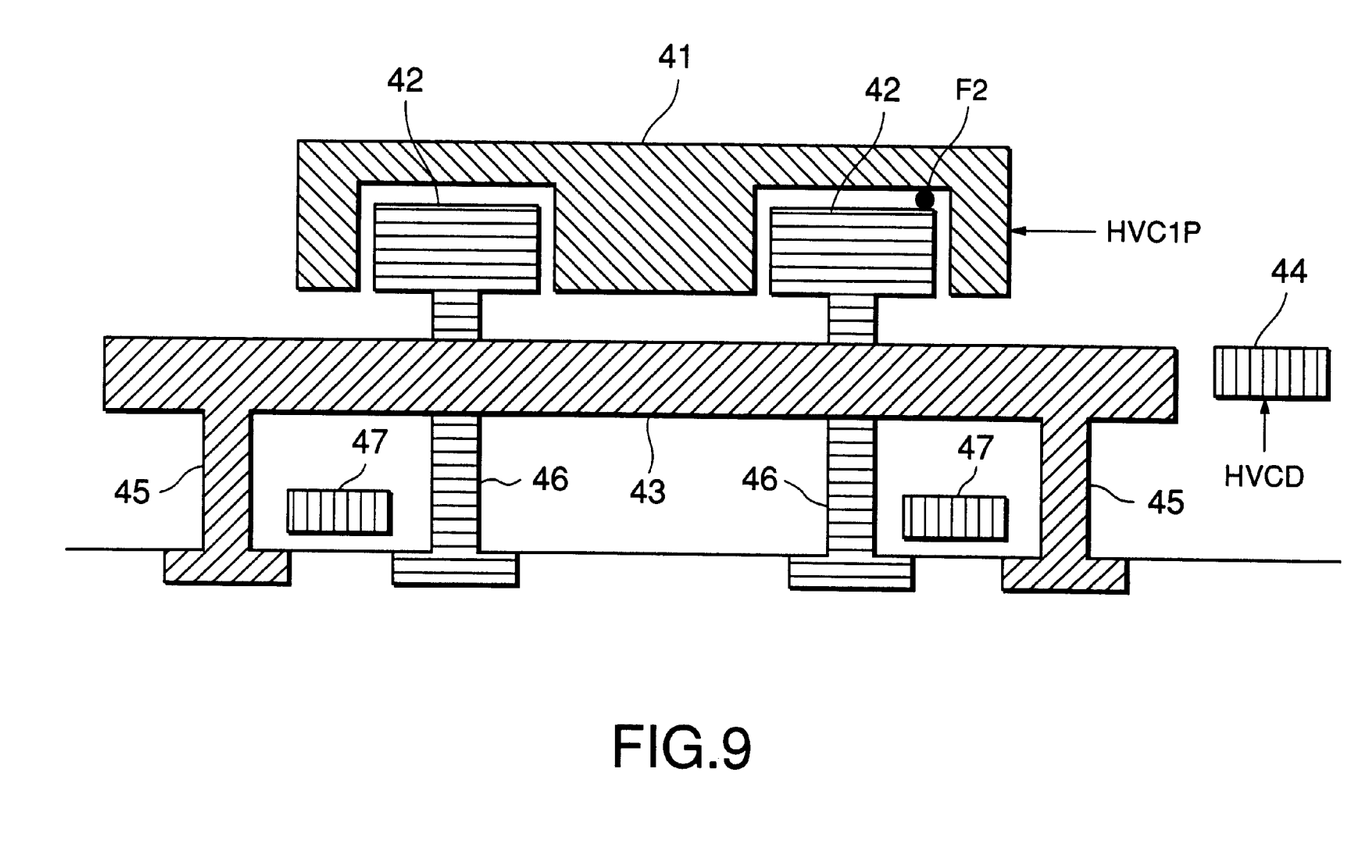
FIG. 9 is a cross section of a DRAM memory cell, which has an insulation breakdown between a capacitor and paired electrodes of memory cells.
Figure 10:
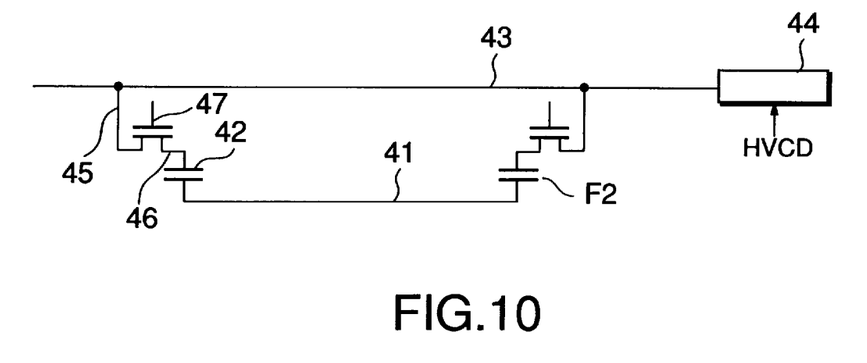
FIG. 10 is an equivalent circuit of the DRAM memory cell shown in FIG. 9.

The reason for that, during the aging, the voltage stress is effective for the capacitor 42 of the DRAM memory cell will be described with reference to FIGS. 9 and 10, in which FIG. 9 is a cross section of a DRAM memory cell, showing a state where the insulation of the capacitor of the DRAM memory cells shown in FIG. 4 is broken down and FIG. 10 is an equivalent circuit of the DRAM memory cell shown in FIG. 9. In this case, it is assumed that the DRAM memory is a 1K refresh device and the leak voltage a from the capacitor thereof during a data hold period is in the order of 0.2V.

The DRAM memory cell is activated at frequency of once per 1024 by a refresh during a normal operation. By the activation of the DRAM memory cell, a potential difference between the electrode 41 of the paired memory cells and the digit line 43 is added to the capacitor 42. The potential difference during the activated state differs from that during the non-activated state by α. The maximum value of the potential difference of the capacitor during the normal operation is Vcc/2.

When the digit line is held at the ground potential during the aging period, the maximum value of the potential difference of the capacitor 42 during the aging becomes Vcc for the same reason as that during the normal operation and the voltage stress to the capacitor 42 becomes more effective.

The breakdown of the DRAM memory may occur due to breakdown of the insulating film, abnormal growth of whisker of semiconductor and/or metal, reduction of thickness of contact protection film, deviation of contact and/or unevenness of capacitive film, etc. In order to facilitate investigation of the cause of breakdown, it is necessary to improve the efficiency of the aging and the failure analysis.

According to the first embodiment mentioned above, since the second output side current path 15 of the current mirror circuit supplies the voltage Vcc/2 to the electrode of the paired memory cells by merely applying the potential of the output signal HVC1P to the node D, it is not influenced by an operation delay of the N channel transistor Qn5. Therefore, the operation for supplying voltage becomes rapid and reliable, so that it is possible to prevent the boot phenomenon at the time when the power source is connected from occurring.

Figure 2:
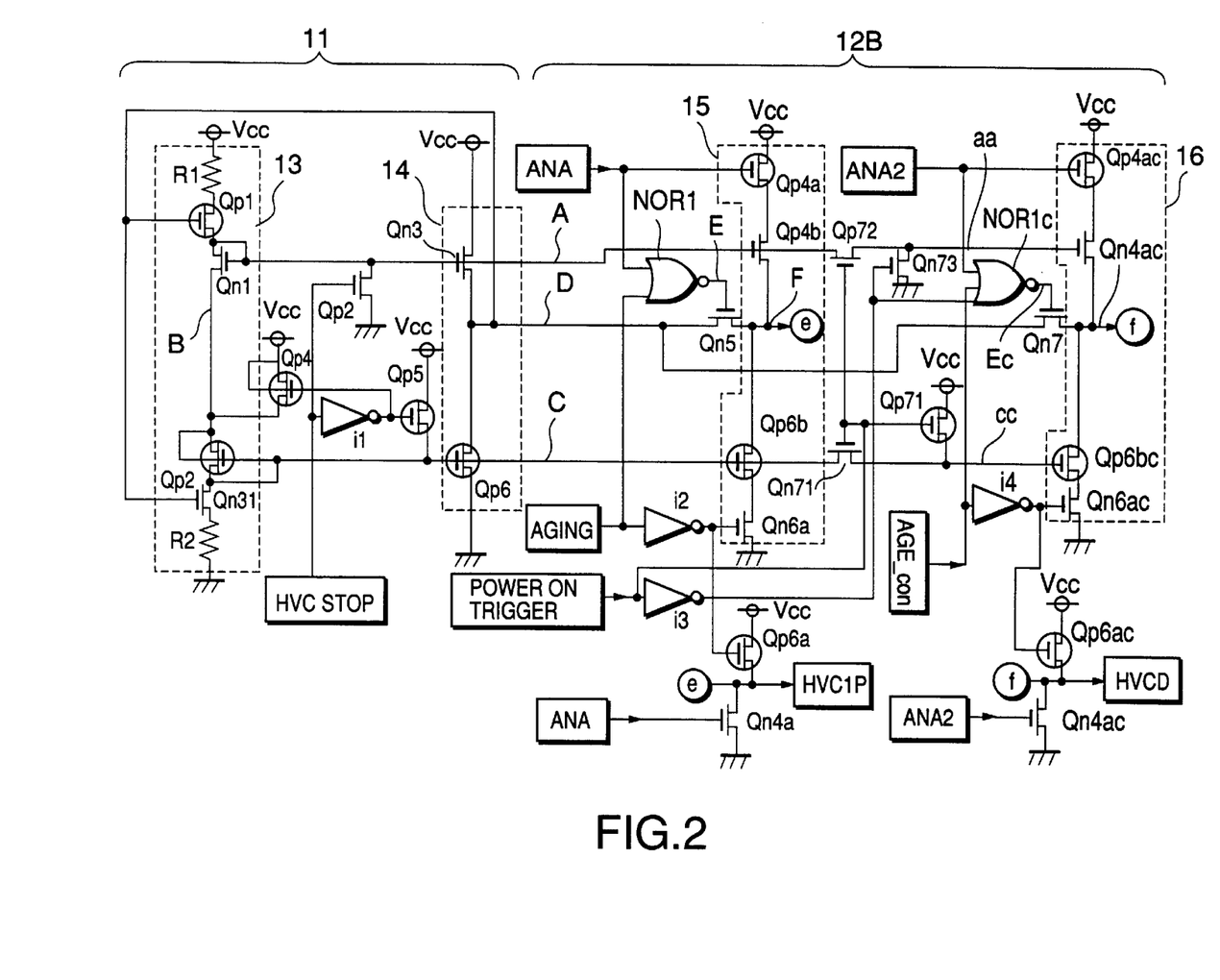
FIG. 2 is a circuit diagram of a semiconductor memory test circuit according to a second embodiment of the present invention.
Figure 3:
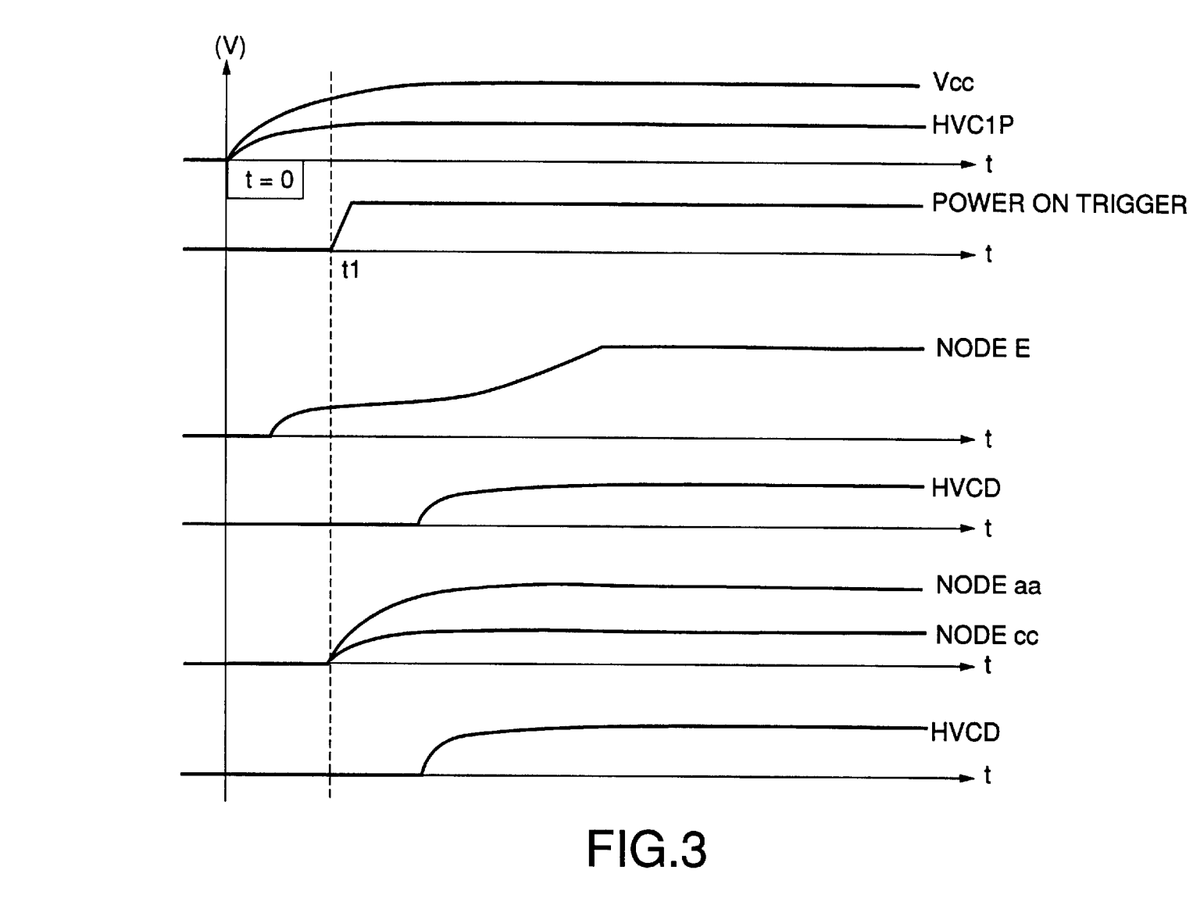
FIG. 3 shows signal waveforms in the semiconductor memory test circuit shown in FIG. 1.

FIG. 2 is a circuit diagram of a semiconductor memory test circuit according to a second embodiment of the present invention. The semiconductor memory test circuit of this embodiment is constructed with a HVC circuit 11, which is the same as the HVC circuit 11 of the first embodiment and a control 10 circuit 12B. The control circuit 12B differs from the control circuit 12A of the first embodiment in that it includes, in addition to a second output side current path 15 which is the same as the second output side current path 15 of the first embodiment, a third output side current path 16 of the current mirror circuit and an input signal AGE-Con for an aging operation of contact and an input signal ANA2 for a contact analysis operation are provided. The third output side current path 16 of the current mirror circuit supplies the voltage Vcc/2 as the input signal HVCD through a P channel transistor Qp6ac. It is assumed that other inputs are in L level unless otherwise specified.

The control circuit 12B is constructed with a switching circuit, the second output side current path 15 of the current mirror circuit and the third output side current path 16 of the current mirror circuit. Now, the switching circuit, which differs from that of the first embodiment, and the newly added third output side current path 16 will be described.

The third output side current path 16 is composed of a P channel transistor Qp4ac, an N channel transistor Qp4ac, a P channel transistor Qp6bc and an N channel transistor Qn6ac, which are series-connected in the order and connected between the power source Vcc and the ground potential. A gate of the N channel transistor Qp4ac of the third output side current path 16, which is connected to a node aa, is connected to the n o d e A through an N channel transistor Qn72 and to the ground through an N channel transistor Qn73. A gate of the P channel transistor Qp6bc of the third output side current path 16, which is connected to a node cc, is connected to the node C through an N channel transistor Qn71 and to the power source Vcc through a P channel transistor Qp71. A node G connected to sources of the transistors Qp4ac and Qp6bc is connected to the output HVCD, to the node D through the N channel transistor Qn7, to the power source Vcc through the P channel transistor Qp6ac and to the ground through the N channel transistor Qp4ac.

The third output side current path 16 of the current mirror circuit, which operates when the node A (or C) is connected to the node aa (or cc), operates in the same way as that of the first output side current path 14 in response to an operation of the reference side current path 13.

The input signal ANA2 is supplied to a first input of a 3-input NOR gate NOR1c, the gate of the P channel transistor Qp4ac and the gate of the N channel transistor Qp4ac.

The input signal AGE-Con is supplied to a second input of the 3-input NOR gate NOR1c and an input of an inverter i4. An output of the inverter i4 is connected to the gates of the N channel transistor Qn6ac and the P channel transistor Qp6ac. An output of the 3-input NOR gate NORi1c is connected to the gate of the N channel transistor Qn7.

The input signal Power-on-Trigger is supplied to the gate of the transistor Qn71, the gate of the transistor Qn72, the gate of the transistor Qp71 and an input of an inverter i3. An output of the inverter i3 is connected to the gate of the transistor Qn73 and a third input of the 3-input NOR gate NOR1c.

When the input signals ANA2 and AGE-Con are in L level, the transistors Qp4ac, Qn6ac and Qn7 are turned ON and the transistors Qp6ac and Qp4ac are turned OFF. Therefore, the third output side current path 16 operates and the output signal HVCD becomes Vcc/2.

When the input signal ANA2 is in H level, the transistor 15 Qp4ac is turned ON and the transistors Qp4ac and Qn7 are turned OFF. Therefore, the function of the third output side current path 16 is stopped, so that the output signal HVCD becomes Vcc.

When the input signal Power-on-Trigger is in L level, the transistors Qn72 and Qn71 are turned OFF and the transistors Qn73 and Qp71 are turned ON. Therefore, the node aa is fixed to the ground level and the node cc is fixed to Vcc, so that the function of the third output side current path 16 is stopped and the output signal HVCD becomes high impedance.

When the input signal Power-on-Trigger is in H level, the transistors Qn72 and Qn71 are turned ON and the transistors Qn73 and Qp71 are turned OFF. Therefore, the third output side current path 16 functions and the output signal HVCD becomes Vcc/2.

The purpose of the input signal ANA2 is to switch the level of the output signal HVCD between ground potential and Vcc/2. That is, the input signal ANA2 is made H level during the failure analysis to set the output signal HVCD to the ground level and is made L level during the normal operation to set the output signal HVCD to Vcc/2. The failure analysis is performed for the insulation breakdown between a gate and the first contact.

The input signal AGE-Con is to switch the output signal HVCD between Vcc level and Vcc/2 level. That is, the input signal AGE-Con is made H level during the aging to set the output signal HVCD to the Vcc level and is made L level during the normal operation to set the output signal HVCD to Vcc/2. The potential of the output signal HVCD is supplied to the digit line through the sense amplifier. The potential of the gate connected to the word line is Vcc+2Vt during the active period and the ground potential during the inactive period. In the case of the 1K refresh device as the DRAM memory, the number of operations in the inactive period is 1023 per one operation in the active period. Since the value of the maximum potential difference becomes Vcc during the inactive period, the voltage stress between the first contact connected to the digit line and the gate becomes effective.

Now, the failure analysis for the insulation breakdown between the first contact and the gate will be described. First, the input signal AGE-Con is made H level and the aging, for which the voltage stress is effective, is performed for the first contact and the gate. Then, the DRAM memory cell is written with 1 or 0. Further, the input signal ANA2 is made H level to switch the digit line from Vcc/2 to the ground level and the DRAM memory cellis read.If theread-out valueis differentfrom thewritten value, it can be judged that there is an insulation breakdown between the first contact and the gate.

In the semiconductor memory test circuit according to this embodiment, it is possible to effectively select one of the aging and the failure analysis between the first contact and the gate or between capacitances.

As described hereinbefore, according to the semiconductor memory test circuit of the present invention, the working efficiency is improved since it is possible to select effective one of the aging and failure analysis for the semiconductor memory to be tested without boot phenomenon.

Although the present invention has been described with reference to specific embodiments, this description is not meant to be construed in a limiting sense. Various modifications of the disclosed embodiments will become apparent to persons skilled in the art upon reference to the description of the invention. It is, therefore, contemplated that the appended claims will cover any modifications or embodiments as fall within the true scope of the invention.

What is claimed is:

1. A semiconductor memory test circuit comprising a current mirror circuit including a reference side current path composed of a series connection of alternating P channel transistors and N channel transistors and an output side current path composed of a series connection of alternating P channel transistors and N channel transistors, an output signal for an electrode of paired memory cells and a balance potential output signal for a sense amplifier, required for a semiconductor memory test, being derived from said output side current path,
   wherein said current mirror circuit includes a first output side current path and a second output side current path, the balance output for said sense amplifier is derived from an output of said first output side current path and the output signal for said electrode of paired memory cells is derived from an output of said second output side current path.

2. A semiconductor memory test circuit as claimed in claim 1, wherein said output of said first output side current path is connected to said output of said second output side current path through a switching transistor.

3. A semiconductor memory test circuit as claimed in claim 1 or 2, wherein the output signal for said electrode of paired memory cells is set to a half of a power source voltage, the power source voltage or ground potential.

4. A semiconductor memory test circuit as claimed in claim 1 or 2, wherein the balance potential output signal for said sense amplifier is set to a half of a power source voltage, the power source voltage or ground potential.

5. A semiconductor memory test circuit as claimed in claim 3, wherein the balance potential output signal for said sense amplifier is set to a half of a power source voltage, the power source voltage or ground potential.

6. A semiconductor memory test circuit comprising:
   a first current mirror circuit including a first N channel transistor provided between a first power source terminal and a first node, a second N channel transistor provided between said first power source terminal and a second node and a third N channel transistor provided between said first power source terminal and a third node, gates of said first, second and third N channel transistors being connected commonly;
   a second current mirror circuit including a first P channel transistor provided between a second power source terminal and said first node, a second P channel transistor provided between said second power source terminal and said second node and a third P channel transistor provided between said second power source terminal and said third node, gates of said first, second and third P channel transistors being connected commonly;
   a balance potential output terminal for a sense amplifier, connected to said second node; and
   an output terminal for electrode of paired memory cells, connected to said third node.

7. A semiconductor memory test circuit as claimed in claim 6, further comprising a series connection of a fourth P channel transistor and a first resistor, provided between said first N channel transistor and said first node and a series connection of a fourth N channel transistor and a second resistor, provided between said first P channel transistor and said first node, wherein a drain and said gate of said first N channel transistor are connected commonly, a drain and said gate of said first N channel transistor are connected commonly and gates of said fourth N channel transistor and said fourth P channel transistor are connected to said second node.

8. A semiconductor memory test circuit as claimed in claim 7, further comprising switch means provided between said second node and said third node, said switch means being turned on by a control signal.

9. A semiconductor memory test circuit as claimed in claim 7, further comprising:
   a fifth P channel transistor provided between said first power source terminal and said third node;
   a fifth N channel transistor provided between said second power source terminal and said third node; and
   control signal generator means for generating a first control signal to be supplied to a gate of said fifth P channel transistor and a second control signal to be supplied to a gate of said fifth N channel transistor.

* * * * *